United States Patent [19]

Komoto

[11] Patent Number: 5,753,940
[45] Date of Patent: May 19, 1998

[54] LIGHT-EMITTING DIODE HAVING NARROW LUMINESCENCE SPECTRUM

[75] Inventor: Satoshi Komoto, Tokyo, Japan

[73] Assignee: Kabushiki Kaisha Toshiba, Kawasaki, Japan

[21] Appl. No.: 730,060

[22] Filed: Oct. 15, 1996

[30] Foreign Application Priority Data

Oct. 16, 1995 [JP] Japan ............................ 7-267373

[51] Int. Cl.$^6$ .............................................. H01L 33/00
[52] U.S. Cl. .................... 257/95; 257/98; 257/103; 257/622
[58] Field of Search ................... 257/89, 95, 98, 257/103, 622, 623

[56] References Cited

FOREIGN PATENT DOCUMENTS

| 61-125092 | 6/1986 | Japan . |
| 1-312871 | 12/1989 | Japan . |
| 7-131066 | 5/1995 | Japan . |

OTHER PUBLICATIONS

\* Note: English Abstracts of Japanese Patent Laid–open Publications Nos. 61-125092, 1-312871, and 7-131066 are provided herewith. No date.

*Primary Examiner*—Minh-Loan Tran
*Attorney, Agent, or Firm*—Finnegan, Henderson, Farabow, Garrett & Dunner, L.L.P.

[57] ABSTRACT

In a compound semiconductor LED, a groove is formed at a peripheral area of a chip constituting LED, the groove having a depth penetrating from the light output plane into a light emitting layer of LED. An angle $\theta_1$ ($0 \leq \theta_1 < 90°$) and an angle $\theta_2$ ($0 \leq \theta_1 < 90°$) satisfy the following formula:

$$n \cdot \sin[\theta_2 - \arcsin(\sin\{\theta_1 + \theta_2 - \arcsin(n \cdot \sin\theta_1)\}/n)] \geq 1$$

where the angle $\theta_1$ is an angle between the surface of a side wall at the inner side of the groove cutting the light emitting layer and the surface vertical to the chip front surface, the angle $\theta_2$ is an angle between the surface of a side wall at the outer side of the groove cutting the light emitting layer and the surface vertical to the chip front surface, n1 is a refractive index of the light emitting layer, n2 is a refractive index of material embedded in the groove, and n=n1/n2.

27 Claims, 7 Drawing Sheets

LIGHT-EMITTING DIODE HAVING NARROW LUMINESCENCE SPECTRUM

BACKGROUND OF THE INVENTION

1. Field of the Invention

The preset invention relates to a semiconductor light emitting diode (LED) having excellent monochromaticity, the LED is made of a lamination of compound semiconductor layers including a light emitting layer formed on a compound semiconductor substrate.

2. Description of the Related Art

A conventional light emitting diode (LED) made of a lamination of compound semiconductor layers (such as InGaAlP layers) side by side on a compound semiconductor substrate has the structure such as shown in FIG. 1.

On an n-type GaAs substrate 1 of LED shown in FIG. 1, an n-type InGaAlP clad layer 2, an n-type InGaAlP active layer (light emitting layer) 3, a p-type InGaAlP clad layer 4, and a p-type GaAlAs current diffusion layer 5 are sequentially laminated one on top the other. A p-side electrode 6 is formed on the current diffusion layer 5 and an n-side electrode 7 is formed on the GaAs substrate side. Most light generated in the light emitting layer 3 of LED is output vertically to the external from the p-side electrode 6 side.

Light generated in the light emitting layer 3 of LED includes the light which propagates generally in parallel with the lamination plane of the light emitting layer 3 and is output horizontally to the external from the chip side wall and the light which propagates generally vertically to the lamination plane of the light emitting layer 3 and is output to the external from the chip front side (p-side electrode 6 side). Of the two kinds of light, the light propagating in parallel with the light emitting layer 3 is radiated to the external via a longer optical path in the light emitting layer 3 than the vertically propagating light. Therefore, selective wavelength absorption occurs among the light propagating in parallel with the light emitting layer 3, namely, the light emitting layer 3 absorbs light having a wavelength near emission light wavelength. The spectrum of the light radiated from the chip side wall therefore shifts to the longer wavelength region from the original emission wavelength determined by the LED material.

On the other hand, the light propagating vertically to the light-emitting layer 3 has a shorter optical path in the laminated semiconductor layers 3, 4, 5 than the light propagating in parallel. Therefore, selective wavelength absorption becomes considerably small and a wavelength shift of radiated light rarely occurs.

Since the wavelength of light radiated from the chip side wall shifts to the longer wavelength side from a desired light emission spectrum, the luminescent color of light radiated from the chip side wall becomes very different from that of light propagating vertically. Therefore, both the luminescent color inherent in the light emitting layer 3 and the luminescent color of light radiated from the chip side wall having a different color from the inherent luminescent color are observed by human eyes as viewed, for example, obliquely or from the front side of LED after molded. Therefore, monochromaticity of the light from the LED is degraded as a whole.

A shift to the longer wavelength side of a red light-emitting element affects less because this shift enters the infrared region. However, with a green light-emitting element, the light emission wavelength of light radiated from the chip side wall shifts to the yellow to orange region. The above-described demerit, therefore, becomes conspicuous.

In order to eliminate such a demerit, the structure shown in FIG. 1 is changed to have a tapered portion at the peripheral area of the chip front side as shown in FIG. 2. This tapered portion reflects downward a portion of the horizontally propagated light, which is to be radiated to the external from the chip side wall without the tapered portion, and the amount of light with a shifted wavelength radiated to the external from the chip side wall can be reduced. However, the advantageous effects can be obtained only when the taper angle θ shown in FIG. 2 is made considerably small. As the taper angle θ is made small, the light output area or the flat area of the current diffusion area 5 becomes small so that brightness per unit chip area lowers. If the structure has a light reflection layer such as quarter-wave stacks (Bragg mirrors) under the light emission layer 3, light reflected downward from the tapered portion is again reflected upward by this light reflection layer. With this structure, light with a shifted wavelength is radiated from the front side more than the structure shown in FIG. 1, leading rather to a reverse effect.

Another conventional technique relevant to a semiconductor LED with a groove, for example, Japanese Patent Laid-open Publication No. 61-125092, describes an LED which has a high efficiency of coupling with an optical fiber because a light emission diameter is made small by forming a ring shaped groove having a 30 μm or smaller diameter surrounding a light emission area and penetrating through the active layer to limit the light emission area of the active layer only to the inner area of the ring shaped groove. This groove is used for reducing the light emission diameter, and LED with such a small light emission diameter is essentially free from a wavelength shift problem. A slit light LED is described in Japanese Patent Laid-open Publication No. 1-312871 which LED has a slit-shaped uniform output light intensity distribution because a groove having a vertical side wall is formed penetrating through the active layer of a quantum well structure to define a mesa structure having a width corresponding to the width of output slit light. This groove is used not for improving monochromaticity of light emission wavelength but for radiating narrow slit-shaped light having a width of 50 mμ. In another LED described in Japanese Patent Laid-open Publication No. 7-131066, a tapered groove is formed and a reflection film is formed on this taper groove to reflect upward the light propagating in parallel with the light emitting layer. With this structure, however, light with a shifted wavelength is radiated from the front side, leading rather to a reverse effect.

SUMMARY OF THE INVENTION

An object of the invention is to solve the above problems and provide a semiconductor light emitting diode with a light emission diameter (or a side of a light emission area) sufficiently larger than the total thickness of a light emitting layer and upper layers, having excellent monochromaticity by suppressing the light radiation horizontally propagating and leaking from a chip side wall.

In order to achieve the above object, the invention provides a semiconductor light emitting diode (LED) having as its principal constituent element a semiconductor chip including at least an active layer 3 serving as a light emitting layer as illustratively shown in FIGS. 3B and 5A. The LED comprises a groove 8 at least penetrating through the active layer 3, the groove 8 being formed at the peripheral area of the semiconductor chip, surrounding the central area of the semiconductor chip, as shown in FIG. 3A, and the angle of a side wall plane of the groove 8 cutting the active layer 3 being selected to have a specific angle so as not to leak light propagating in parallel with the plane of the active layer, to the external of the semiconductor chip.

More specifically, the invention relates to a semiconductor light emitting element such as the LED shown in FIG. 3B having the structure with a relatively large area of a light emission diameter (or a relatively large dimensional ratio of horizontal length to vertical length) so large as it makes an issue of wavelength shift caused by absorption of light propagating in parallel with the active layer. The groove 8 has a depth penetrating from the light output plane through the LED active layer and the invention is features in that the angle of the side wall of the groove 8 is set as in the following. The groove 8 has, as shown in FIG. 3A, an inner side wall (9,81) and an outer side wall (10,82). An angle $\theta_1$ ($0 \leq \theta_1 < 90°$) and an angle $\theta_2$ ($0 \leq \theta_2 < 90°$) satisfy the following formula (1):

$$n \cdot \sin [\theta_2 - \arcsin(\sin \{\theta_1 + \theta_2 - \arcsin (n \cdot \sin \theta_1)\}/n)] \geq 1 \quad (1)$$

wherein as shown in FIGS. 3C and 3D, the angle $\theta_1$ is an angle between the surface of the inner side wall 9 facing the active layer 3 and the surface 81 vertical to the plane of the active layer, the angle $\theta_2$ is an angle between the surface of the outer side wall 11 facing the active layer 33 and the surface 82 vertical to the plane of the active layer, n1 is a refractive index of the active layer 3, n2 is a refractive index of substance embedded in the groove 8, and n=n1/n2. The substance embedded in the groove 8 may be molding resin, an insulating film such as $SiO_2$, or gas such as $N_2$ and air.

The formula (1) can be derived as in the following. As shown in FIG. 3D, by representing an angle between light refracted at the surface of the inner side wall 9 and the normal of the surface of the inner side wall by $\alpha$, the following relationship is given from the Snell's law as applied to the surface of the inner side wall 9:

$$n \cdot \sin \theta_1 = \sin \alpha \quad (2)$$

The following relationship is given from the Snell's law as applied to the surface of the outer side wall 11, by representing an angle between light incident to the outer side wall 11 and the normal of the surface of the outer side wall 11 by $\beta$ and by representing an angle between light refracted at the surface of the outer side wall 11 and the normal of the surface of the outer side wall 11 by $\gamma$:

$$\sin \beta = n \cdot \sin \gamma \quad (3)$$

In order not to transmit light refracted at the surface of the outer side wall 11 through the chip side wall 10, an angle $\delta$ between light incident to the chip side wall 10 and the normal of the chip side wall 10 must satisfy the following relationship:

$$n \cdot \sin \delta \geq 1 \quad (4)$$

If light is incident upon the chip side wall 10 at an angle equal to or larger than $\delta$ satisfying the formula (4), then the light is totally reflected and will not leak to the external of the chip. As apparent from FIG. 3D, since $$\alpha - \beta = \theta_1 + \theta_2 \quad (5)$$

$$\delta - \gamma = \theta_2 \quad (6),$$

the equation (3) becomes:

$$\begin{aligned} n \cdot \sin \delta &= n \cdot \sin(\sin \theta_2 + \gamma) \quad (7)\\ &= n \cdot \sin[\theta_2 + \arcsin\{(\sin \beta / n)\}]\\ &= n \cdot \sin[\theta_2 + \arcsin\{(\sin(\alpha - \theta_1 - \theta_2))/n\}] \geq 1. \end{aligned}$$

The equation (1) can be derived by substituting $\alpha = \arcsin(n \cdot \sin \theta_1)$ into the formula (7).

If the angles $\theta_1$, $\theta_2$ of the side wall plane of the groove 8 cutting the active layer 3 is selected so as to satisfy the formula (1), light propagating in parallel to the plane of the active layer 3 will not leak to the external of the semiconductor chip. Therefore, light propagating in parallel with the active layer, which is likely to generate a shift of the light emission wavelength to the longer wavelength region, will not radiated to the external of the chip and monochromaticity of LED can be made excellent.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

DETAILED DESCRIPTION OF THE EMBODIMENTS

Figure 1:
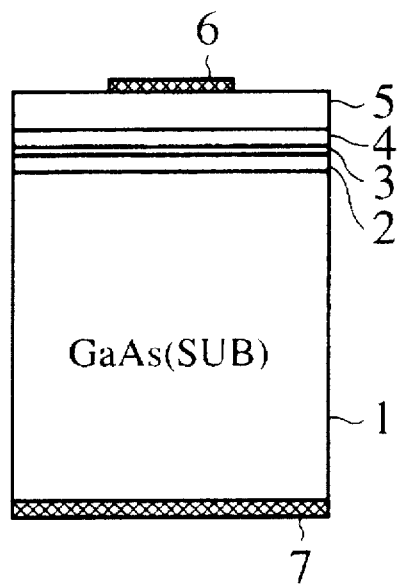
FIG. 1 is a cross sectional view of a conventional semiconductor light emitting diode (LED).
Figure 2:
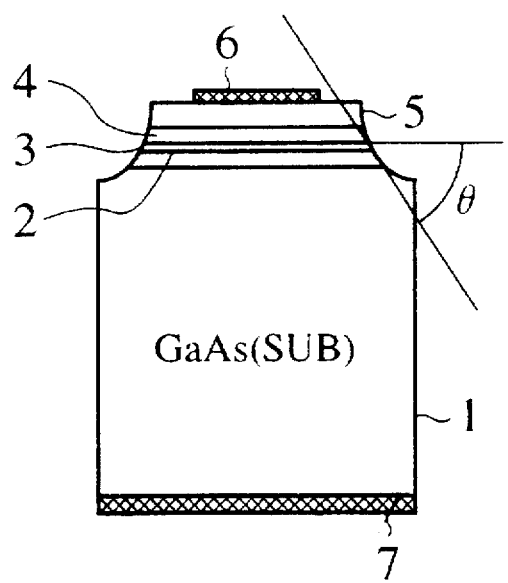
FIG. 2 is a cross sectional view showing the structure of another conventional LED.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor light emitting devices, it will be appreciated that the various drawings are not drawn to scale from one figure to another nor inside a given figure, and in particular that the layer thicknesses are arbitrarily drawn for facilitating the reading of the drawings.

(First Embodiment)

Figure 3A:
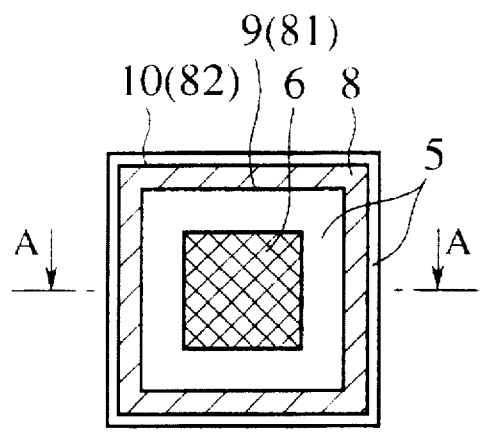
FIGS. 3A to 3C are diagrams showing the structure of an LED according to a first embodiment of the invention.
Figure 3B:
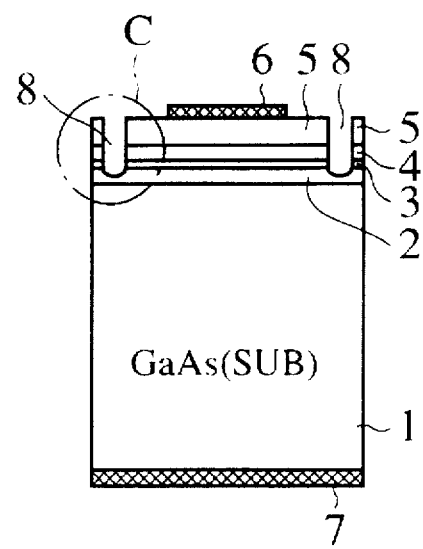
Figure 3C:
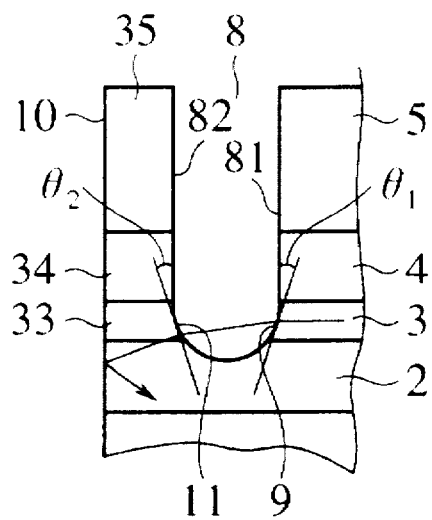
Figure 3D:
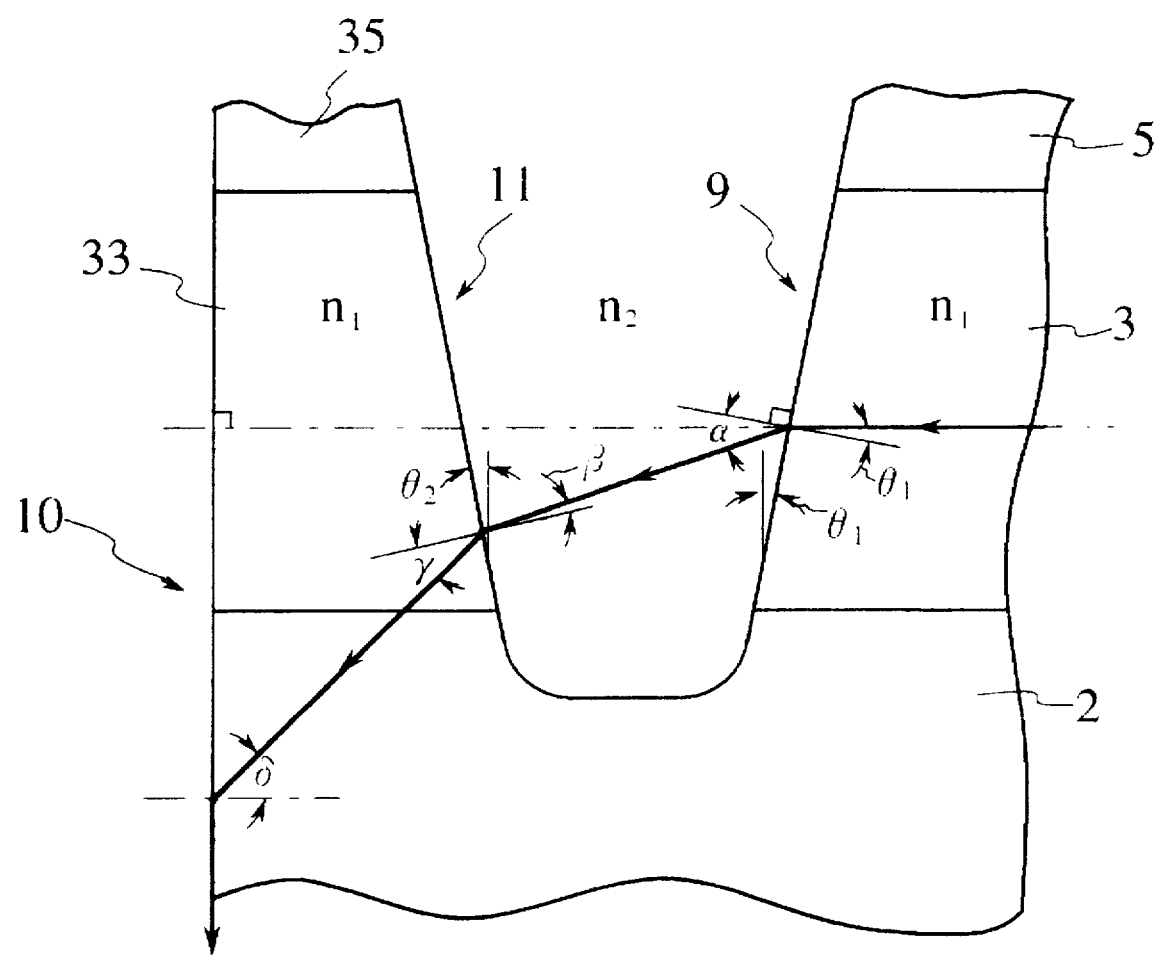
FIG. 3D is an enlarged view of FIG. 3C, illustrating how the formula (1) is derived.

FIG. 3A is a plan view of an LED according to the first embodiment of the invention, and FIG. 3B is a cross sectional view taken along line A—A in FIG. 3A. FIG. 3C is an enlarged view of a portion C shown in FIG. 3B. FIG. 3D is an enlarged view of FIG. 3C detailing a critical optical path in LED, which will not leak out from the side wall 10.

As shown in FIG. 3B, on an n-type GaAs substrate 1 of LED of the first embodiment of the invention, an n-type InGaAlP clad layer 2 of 0.2 to 2 µm thick, an n-type InGaAlP active layer (light emitting layer) 3 (33) of 0.2 to 2 μm thick, a p-type InGaAlP clad layer 4 of 0.2 to 2 μm, and a p-type GaAlAs current diffusion layer 5 of 2 to 8 μm are sequentially laminated. A p-side electrode 6 is formed on the current diffusion layer 5 and an n-side electrode 7 is formed on the GaAs substrate side. A length of each side at the outer periphery of the chip shown in FIG. 3A is 100 to 1000 μm which is about 30 to 300 times the total thickness of the active layer 3, p-type clad layer 4, and current diffusion layer 5.

The feature of LED of the first embodiment of the invention resides in that a groove 8 of a predetermined shape is formed at the chip peripheral area, penetrating from the surface of the current diffusion layer 5 serving as the light radiation surface through the active layer 3 (33). Specifically, as shown in FIG. 3A, the groove 8 of the first embodiment of this invention has an inner side wall 9, 81 and an outer side wall 10, 82. As particularly shown in FIGS. 3B and 3C, although this groove 8 has the side walls 81 and 82 generally vertical to the chip surface at the upper portion of the groove 8, the side walls 9 and 11 facing the active layer 3 at the deeper portion of the groove 8 have predetermined angles. These angles satisfy the relationship defined by the formula (1) wherein the angle $\theta_1$ ($0 \leq \theta_1 < 90°$) is an angle between the surface of the inner side wall 9 cutting the active layer 3 and the surface 81 vertical to the active layer, the angle $\theta_2$ ($0 \leq \theta_2 < 90°$) is an angle between the surface of the outer side wall 11 cutting the active layer 33 and the surface 82 vertical to the active layer, n1 is are fractive index of the active layer 3, 33, n2 is are fractive index of resin sealing the chip and embedded in the groove 8, and n=n1/n2. Instead of the sealing resin, an insulating film such as $SiO_2$ and $Si_3N_4$, or a polyimide film may be used. Further, $N_2$, Ar or air may be filled in the groove 8 to form an air gap structure.

The angles $\theta_1$ and $\theta_2$ and refractive index ratio n=n1/n2 satisfying the formula (1) are calculated as in the following Table 1, assuming that the refractive index of the active layer 3, 33 is about 3.4 (the refractive indices of other semiconductor layers take also similar values) and the refractive index of the sealing resin is about 1.5. If the angles $\theta_1$ and $\theta_2$ are equal to or larger than the critical angle shown in Table 1, light propagating in parallel with the active layer 3 will not be radiated to the external.

TABLE 1

| Refractive index ratio | Critical angle $\theta_1$, $\theta_2$ (°) |
|---|---|
| 2.0 | 25.7 |
| 2.1 | 23.7 |
| 2.2 | 22.0 |
| 2.3 | 20.5 |
| 2.4 | 19.1 |
| 2.5 | 18.0 |
| 2.6 | 16.9 |
| 2.7 | 16.0 |
| 2.8 | 15.2 |
| 2.9 | 14.4 |
| 3.0 | 13.8 |

The width of the groove 8 is preferably made as small as possible in order to broaden the light emission area, so long as it is broader than the light emission wavelength. Namely, the minimum width of the groove 8 is determined in accordance with the depth of the groove 8 and the precision of the etching technology. For example, the width may be about 1 to 20 μm, and more preferably 4 to 8 μm. If isotropic etching is used, the width of the groove becomes about two times the depth of the groove. For example, if the size of an opening of an etching mask is 4 μm and the groove is etched to a depth of 8 μm, then the final width of the groove is 20 μm. FIGS. 3B and 3C are schematic cross sectional views, and the cross section of the groove is not limited only to that shown in FIGS. 3B and 3C. A cross section of generally a semicircular shape may be used as far as the angles $\theta_1$ and $\theta_2$ at the active layer 3, 33 satisfy the formula (1).

The active layer 33 between the surface of the side wall 11 at the outside of the groove 8 and the surface of the chip side wall 10 is not supplied with a diode current and does not emit light. Therefore, in order to broaden the active (radiative) light emission area, it is preferable to form the groove 8 near at the chip outer periphery and to reduce the area of the non-radiative active layer 33 relative to the radiative active layer 3. Although the groove of a square shape surrounds the chip central area as shown in FIG. 3A, it is a mere example and the shape of the groove may be hexagonal, octagonal, or circular.

Among the light emitted in the active layer 3 of LED shown in FIGS. 3A to 3D, a portion of the light propagating generally in parallel with the light emitting layer 3 is reflected downward at the slanted surface of the inner side wall 9 of the groove 8, absorbed by the GaAs substrate having a very large absorption coefficient, and will not radiate to the external.

Another portion of the light propagating in parallel with the light emitting layer 3 transmits through the slanted inner side wall 9 of the groove 8 as shown in FIGS. 3C and 3D, and becomes refracted light propagating downward depending on the shape of the inner side wall 9. This refracted light propagates in the resin in the groove 8 and reaches the surface of the outer side wall 11 of the groove 8. The light reached the surface of the outer side wall 11 of the groove 8 is further refracted at the surface of the outer side wall 11 depending upon the slanted surface shape of the outer side wall 11. The light refracted downward is totally reflected at the chip side wall 10, enters the inside of the chip, and is absorbed by the GaAs substrate 1. If the light is incident upon the chip side wall 10 at an angle equal to or larger than the angle δ shown in FIG. 3D, the light will not leak to the external of the chip.

As above, by forming the groove 8 in the chip peripheral area and setting the angle $\theta_1$ ($0 \leq \theta_1 < 90°$) between the surface of the inner side wall 9 facing the active layer 3 and the surface 81 vertical to the plane of the active layer and the angle $\theta_2$ ($0 \leq \theta_2 < 90°$) between the surface of the outer side wall 11 facing the light emitting layer 33 and the surface 82 vertical to the plane of the active layer 3, to the values satisfying the formula (1), it becomes possible to prevent the light propagating in parallel with the active layer 3 among the light emitted in the active layer 3 from being radiated to the external of the chip. Light with a wavelength shifted from the original emission wavelength is not therefore observed, and only the original light having the emission wavelength inherent in the active layer 3 is observed. An LED with very excellent monochromaticity can be easily manufactured without using complicated manufacture processes.

In a green LED having a peak light emission spectrum of, particularly 580 nm or shorter, since yellow to orange light is not radiated to the external as opposed to conventional techniques, other colors are not mixed with the inherent green color of light emission. Very distinct effects can therefore be obtained as compared to conventional techniques.

If the angles $\theta_1$ and $\theta_2$ are somewhat smaller than the critical angle, a small amount of light with a shifted wavelength is radiated to the external of the chip. However, this light is radiated toward the downward direction of the chip so that its influence is small. Even in this case, monochromaticity can be improved as compared to conventional techniques. Even if the side walls 9 and 11 are formed by curved surfaces having a plurality of values of $\theta_1$ and $\theta_2$, monochromaticity can be improved so long as the angles satisfy the formula (1).

LEDs shown in FIGS. 3A to 3C can be manufactured in the following method.

Figure 4A:
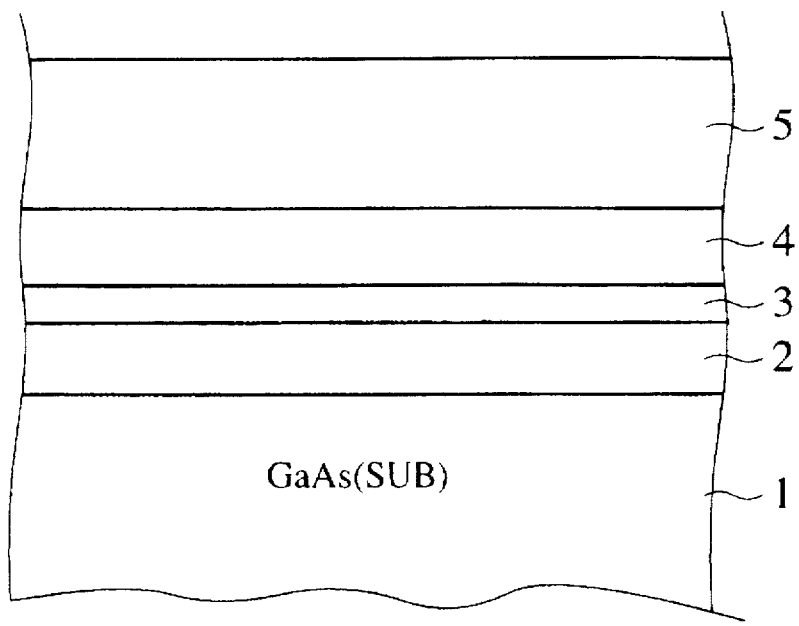
FIGS. 4A to 4D are cross sectional views illustrating manufacturing method of LED of the first embodiment of the invention.

(a) First, as shown in FIG. 4A, by using epitaxial growth techniques such as metal organic chemical vapor deposition (MOCVD), chemical beam epitaxy (CBE), molecular beam epitaxy (MBE), atomic layer epitaxy (ALE), and molecular layer Epitaxy (MLE), an n-$Al_xIn_yGa_{1-x-y}P$ clad layer 2, an undoped $(Al_{0.45}Ga_{0.55})_{0.5}In_{0.5}P$ active layer 3, a p-$Al_xIn_yGa_{1-x-y}P$ clad layer 4, and a p-$Ga_xAl_{1-x}As$ current diffusion layer 5 are grown on an n-GaAs substrate 1 through consecutive epitaxial growth. The n-GaAs substrate 1 may be a 2° to 3° off-substrate doped with Si and having the (100) plane.

Although either atmospheric pressure (AP) MOCVD or low pressure (LP) CVD can be used, LP-MOCVD, particularly vertical type LP-MOCVD is preferable. Group III source gas may be triethyl gallium (TEG), trimethylamine aluminum (TMAAl), trimethyl aluminum (TMAl), trimethyl indium (TMI), or the like, and group V source gas may be phosphine ($PH_3$), arsine ($AsH_3$), or the like. Tertiary butyl phosphine (($C_4H_9$)$PH_2$:TBP), tertiary butyl arsine (($C_4H_9$)$AsH_2$:TBA), and the like may also be used. Dopant gas of an n-type may be monosilane ($SiH_4$), disilane ($Si_2H_6$), or diethyl selenium (DESe), diethyl tellurium (DETe), or the like. Monosilane is generally preferable to use. Dopant gas of a p-type may be diethyl zinc (DEZn), trimethyl gallium (TMG), or the like. These source gas and dopant gas are introduced into a reaction furnace at a pressure of 5 kPa to 10 kPa controlled by a mass flow controller or the like. A ratio of group V gas to group III gas, so-called V/III ratio, is about 120 to 170 for example. The substrate temperature during growth is, for example, about 650° to 700° C.

Figure 4B:
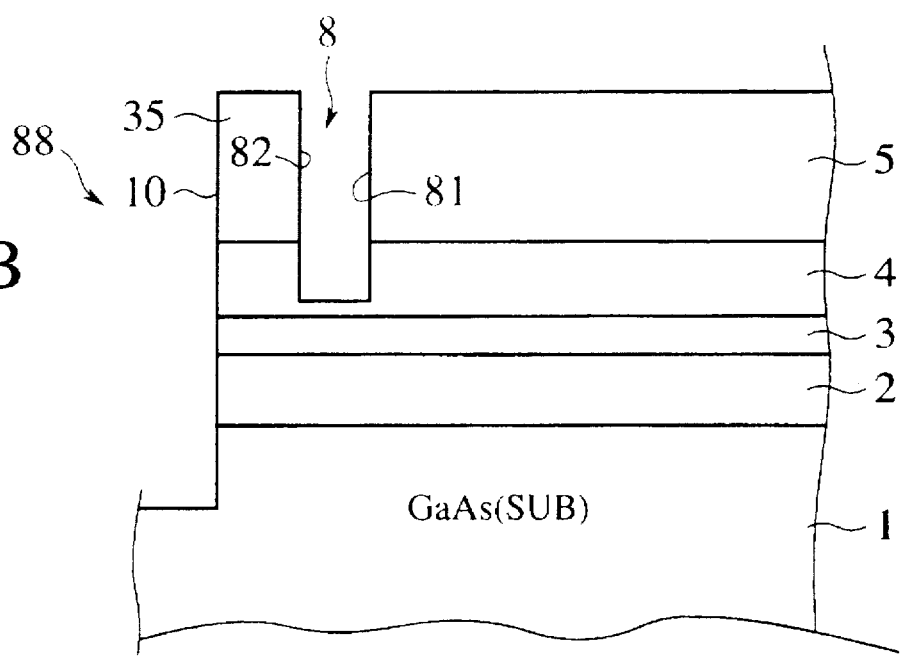

(b) Next, as shown in FIG. 4B, after the wafer with a laminated structure formed through consecutive epitaxial growth is picked out of the reaction furnace, it is etched to form a U groove 88 for a scribing lane (dicing lane) by using a photoresist mask or a double mask of $SiO_2$/photoresist as the etching mask. This U groove 88 is formed in advance in order not to damage the active layer 4 and the like when the wafer is diced by a diamond cutter before the assembly process (in some cases, this process of etching the U groove 88 may be omitted). Etching the groove 88 in the scribing lane is performed by partially etching the current diffusion layer 5, p-type clad layer 4, active layer 3, n-type clad layer 2, and GaAs substrate 1 by using $Cl_2$ based gas such as $BCl_3$, $PCl_3$, and $Cl_2$. And the etching mask is removed.

Next, a new photoresist mask or double mask such as $SiO_2$/photoresist is again formed on the surface of the current diffusion layer 5 as another etching mask. As shown in FIG. 4B, by using this etching mask, the current diffusion layer 5 and p-type clad layer 4 are etched to form a U groove 8. Etching the U groove 8 may be performed by RIE using $Cl_2$ based gas. With this RIE, the U groove with generally vertical side walls 81 and 82 is formed.

Figure 4C:
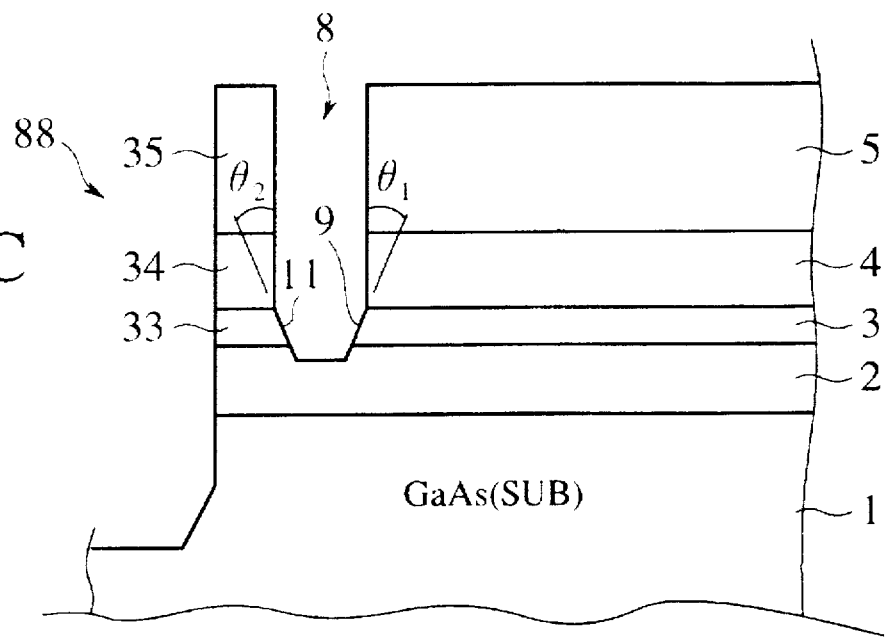

(c) Next, as shown in FIG. 4C, the active layer 3 is wet etched by using hydrochloric acid (HCl) based etchant or the like so as to set the angle $\theta_1$ between the surface of the inner side wall 9 facing the active layer 3 and the surface 81 vertical to the active layer and the angle $\theta_2$ between the surface of the outer side wall 11 facing the active layer 33 and the surface 82 vertical to the chip surface, to the values satisfying the formula (1). For example, this wet etching is performed for 5 to 30 minutes at a room temperature by using hydrochloric acid based etchant. The angles $\theta_1$ and $\theta_2$ at the bottom area of the groove 8 are controlled by the etching time, the temperature of the etchant, the kind, composition or density of the etchant, and the like. The side walls of the groove 8 may be formed with curved surfaces having a plurality of values of the angles $\theta_1$ and $\theta_2$ satisfying the formula (1).

Figure 4D:
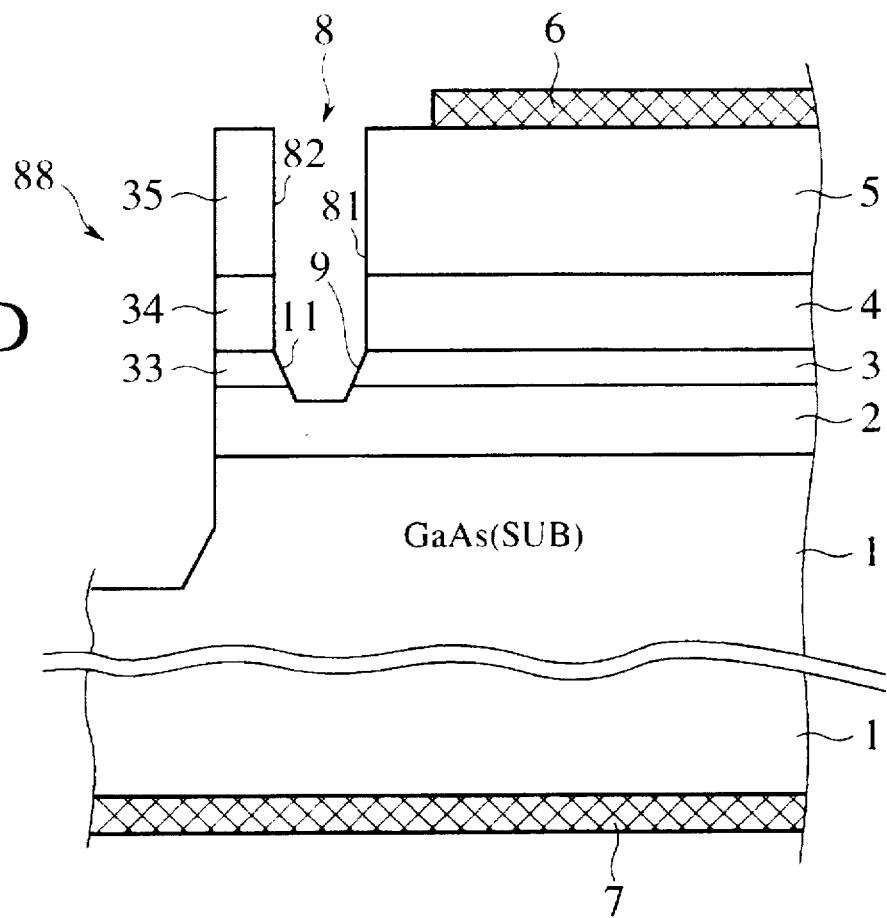

(d) Next, as shown in FIG. 4D, after the photoresist or the like used as the etching mask is removed, a metal film such as Pt/Ta/Au, AuBe, and AuZn is formed on the upper surface of the p-type GaAlAs current diffusion layer only at its predetermined area to form a p-type ohmic metal electrode (p-side electrode) 6. Patterning the p-side electrode 6 is performed by lift-off, or by using etchant such as halogen and halide (such as potassium iodide (KI), etylpyridinium iodide (CPI)). Similarly an n-side electrode 7 such as an AuGe film and an AuGe/Ni film is formed on the bottom surface of the GaAs substrate 1. Thereafter, the electrodes are sintered in an inert gas atmosphere of $H_2$, $N_2$ or the like at 360° to 450° C. Preferably, sintering is performed for about 2 seconds at 360° C. through infrared lamp heating.

(e) After the fundamental structure is formed as above, the wafer is cut (diced) with a diamond cutter along the groove 88 formed at the scribing lane to form a number of chips each cut into a proper size. Cutting may be performed by cleavage. These chips are mounted on a stem or a metal frame and subjected to wire bonding and molding to complete LEDs of this invention.

If the width of the groove 8 is allowed to be broad more or less, the RIE process described with FIG. 4B may be omitted and an isotropic groove may be formed directly through wet etching. Photo-excited etching using excimer laser such as ArF, KrF, XeCl, and XeF or UV light from a high pressure mercury lamp or the like and other gas phase etching may also be used. The groove 8 may be formed after the p-side electrode 6 shown in FIG. 4D is formed.

(Second Embodiment)

Figure 5A:
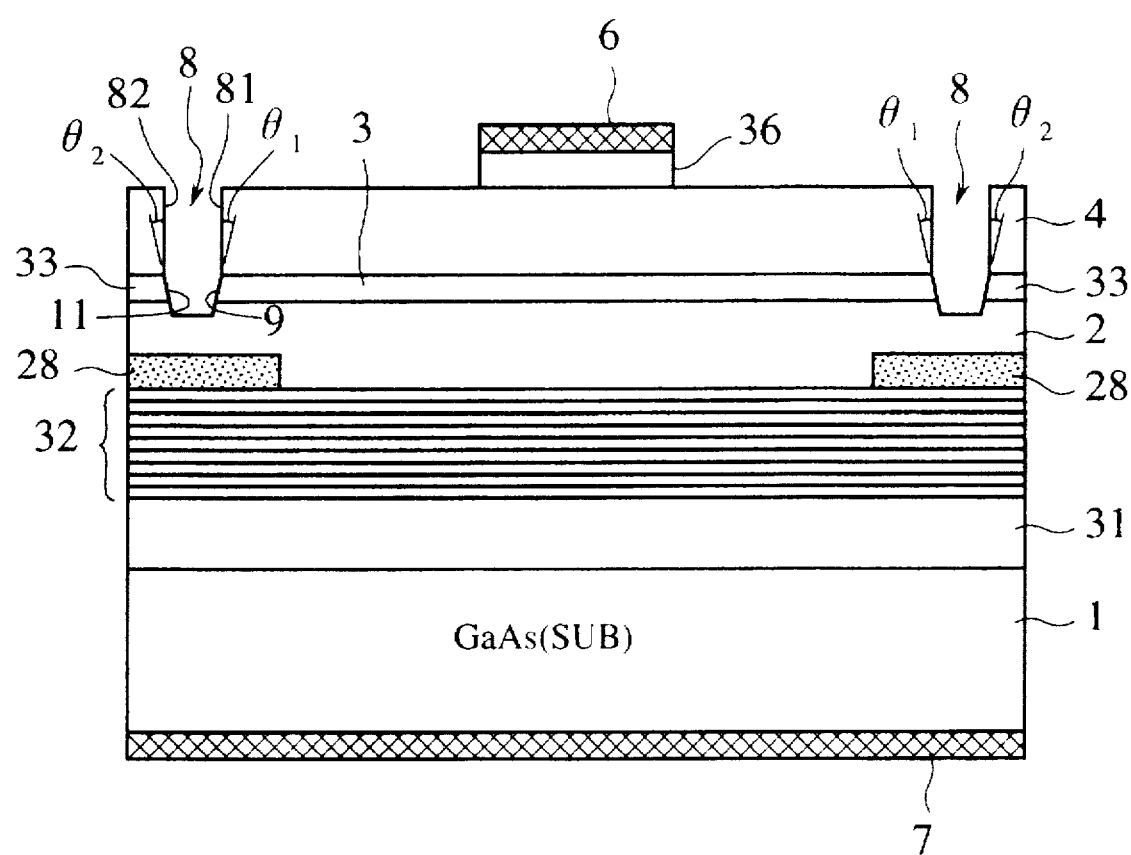
FIGS. 5A and 5B are cross sectional views of an LED according to a second embodiment of the invention.

FIG. 5A shows an example of an AlGaInP double-hetero (DH) structure LED having a Bragg reflector mirror according to the second embodiment of the invention. In LED shown in FIG. 5A, on an n-GaAs substrate 1, an n-GaAs buffer layer 31, multilayer reflection films 32 for the Bragg reflector, an n-$(Al_xGa_{1-x})_{0.5}In_{0.5}$ clad layer 2 of 0.6 μm thick having a carrier concentration of $3 \times 10^{17}$ cm$^{-3}$, an undoped $(Al_yGa_{1-y})_{0.5}In_{0.5}P$ active layer 3 of 0.3 μm thick having a carrier concentration of $1 \times 10^{17}$ cm$^{-3}$ or smaller, a p-$(Al_xGa_{1-x})_{0.5}In_{0.5}P$ clad layer 4 of 3 μm thick having a carrier concentration of $3 \times 10^{17}$ cm$^{-3}$, and a p-GaAs cap layer 36 are sequentially laminated. A p-side electrode 6 is formed on the n-GaAs cap layer 36, and an n-side electrode 7 is formed on the bottom of the n-GaAs substrate 1. In the second embodiment of the invention, light emitted from the active layer 3 is reflected by the semiconductor multilayer reflection films 32 and efficiently radiated from the upper surface of the p-AlGaInP clad layer 4 without being absorbed by the n-GaAs substrate. This semiconductor multilayer reflection film 32 is a Bragg mirror formed by a multilayer of λ/4n films with a high refractive index and $\lambda/4n$ films with a low refractive index, where $\lambda$ is a light emission wavelength of LED and n is a refractive index. The high refractive index film is made of n-$(Al_zGa_{1-z})_{0.5}In_{0.5}P$ ($0\leq z<1$) and the low refractive index film is made of n-$Al_{0.5}In_{0.5}P$. With this structure, a dielectric stack mirror having a high reflectivity in the light emission wavelength range can be formed.

Similar to LED of the first embodiment, LED of the second embodiment of the invention has a groove 8 of a predetermined configuration formed at the chip peripheral area, the groove being formed from the chip surface (serving as the light output surface) penetrating through the active layer 3(33). Specifically, the groove of the second embodiment of this invention has a side wall generally vertical to the chip upper surface at the upper portion of the groove 8, and at the lower portion of the groove, particularly at the portion facing the active layer 3, the side wall of the groove 8 has predetermined angles similar to the first embodiment. The predetermined angles satisfy the formula (1) wherein the angle $\theta_1$ ($0\leq\theta_1<90°$) is an angle between the surface of the inner side wall 9 facing the active layer 3 and the surface 81 vertical to the plane of the active layer, the angle $\theta_2$ ($0\leq\theta_2<90°$) is an angle between the surface of the outer side wall 11 facing the active layer 33 and the surface 82 vertical to the plane of the active layer, n1 is a refractive index of the active layer 3, n2 is a refractive index of substance such as chip sealing resin embedded in the groove 8, and n=n1/n2. As shown in FIG. 5A, under the groove 8, a light absorption region 28 is formed which is made of a semiconductor layer having a forbidden band gap $E_g$ narrower than that of the active layer 3. This forbidden band gap $E_g$ is, for example, 1.75 eV or narrower.

Among the light emitted in the active layer 3 of LED of the second embodiment of the invention shown in FIG. 5A, a portion of the light propagating generally in parallel with the active layer 3 is reflected downward into the chip by the inner side wall 9 of the groove 8. The light reflected by the inner side wall 9 is absorbed by the light absorption region 28 having a very large absorption coefficient, and will not radiate to the external.

Another portion of the light propagating in parallel with the active layer 3 transmits through the inner side wall 9, without being reflected by this side wall 9, and becomes refracted light propagating downward. This refracted light propagates in the resin in the groove 8 and reaches the surface of the outer side wall 11 of the groove 8. The light reached the surface of the outer side wall 11 of the groove 8 is further refracted downward at the surface of the outer side wall 11. The light refracted downward is totally reflected at the chip side wall 10, enters the inside of the chip, and is absorbed by the light absorption region 28. Although the light absorption region 28 is shown in FIG. 5A at the area spaced apart from the bottom of the groove 8, the light absorption region 28 is preferably formed near at the bottom of the groove 8 or in contact with the bottom of the groove 8. As easily understood from geometrical optics, the nearer the light absorption region 28 is formed to the bottom of the groove 8, the smaller the occupied area of the light absorption region 28 becomes. The light absorption region 28 may be formed encroaching upon the active layer 3. And the light absorption region 28 may be formed in the multilayer reflection films 32 under the groove 8.

Figure 5B:
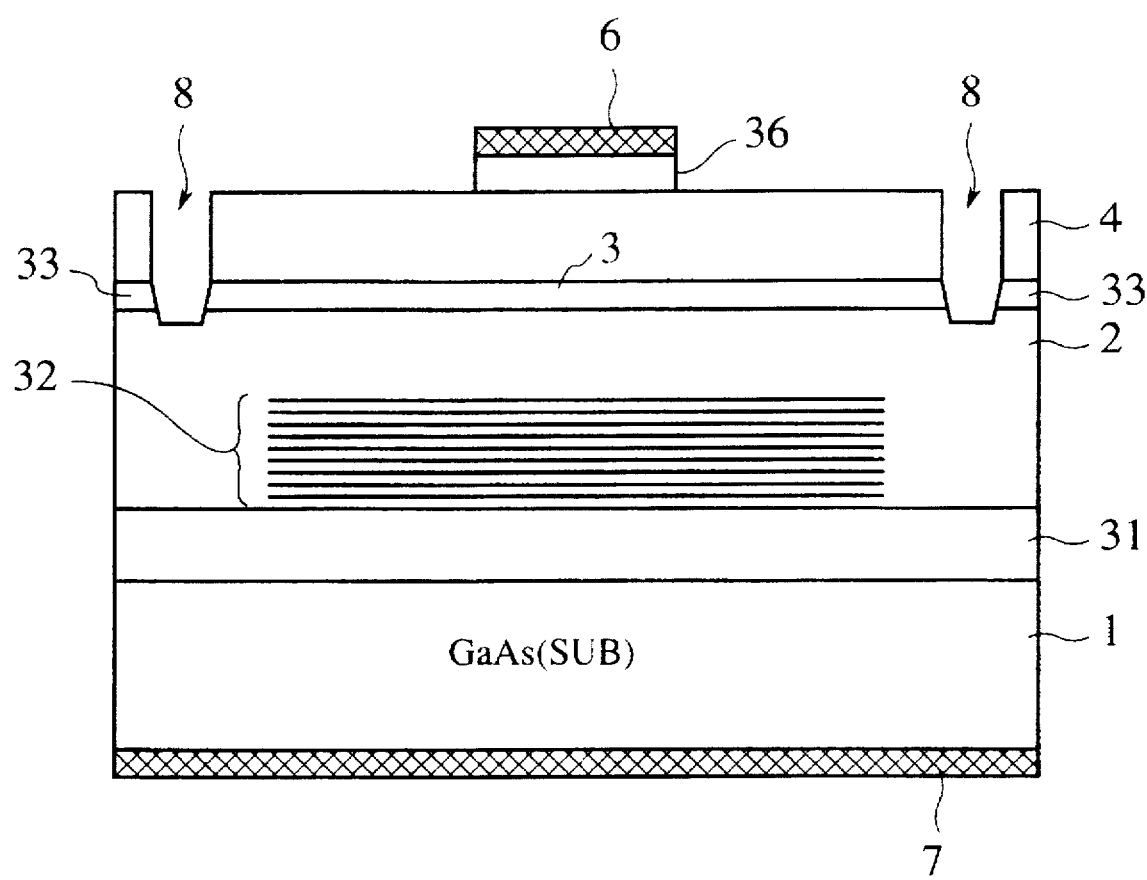

As shown in FIG. 5B, instead of forming the light absorption region 28, the semiconductor multilayer film 32 may be formed at the area other than that under the groove 8. With the semiconductor multilayer films 32 partially formed as shown in FIG. 5B, a portion of the light propagating in parallel with the active layer 3 among the light emitted in the active layer 3 is reflected downward into the chip by the inner side wall 9 of the groove 8, reaches the GaAs substrate 1 having a very large absorption coefficient without being reflected by the multilayer reflection film, is absorbed by the GaAs substrate, and will not radiate to the external. Another portion of the light propagating in parallel with the active layer 3 transmits through the inner side wall 9, is refracted downward at the surface of the inner side wall 9. This refracted light propagates in the resin in the groove 8 and reaches the surface of the outer side wall 11 of the groove 8. The light reached the surface of the outer side wall 11 of the groove 8 is further refracted downward at the surface of the outer side wall 11. The light refracted downward is totally reflected at the chip side wall 10, reaches the GaAs substrate without reaching the multilayer reflection film, and is absorbed by the GaAs substrate 1.

With the structures shown in FIGS. 5A and 5B, it becomes possible to prevent the light propagating in parallel with the active layer 3 among the light emitted in the active layer 3 from being radiated to the external of the chip. Light with a wavelength shifted from the light emission wavelength is not therefore observed, and only the light with the inherent emission wavelength in the active layer 3 is observed. An LED with very excellent monochromaticity can be easily manufactured without using complicated manufacture processes.

Various modifications will become possible for those skilled in the art after receiving the teachings of the present disclosure without departing from the scope thereof.

What is claimed is:

1. A light emitting diode having a semiconductor chip, the semiconductor chip comprising:
   a) a substrate;
   b) a first clad layer of a first conductivity type formed over said substrate;
   c) an active layer of formed on and over said first clad layer;
   d) a second clad layer of a second conductivity type opposite to the first conductivity type formed on and over said active layer; and
   e) a groove penetrating through said second clad layer and said active layer reaching said first clad layer, the groove having side walls at an inner and an outer side of the groove, each side wall cutting said active layer at an angle to refract light at the side wall,
   wherein said groove is formed at a peripheral area of said semiconductor chip, surrounding a central area of said semiconductor chip, the central area having a large horizontal length relative to a total thickness of said active layer and said second clad layer so as to cause a wavelength shift due to absorption of light propagating in parallel with said active layer, said angle being selected so as not to leak said light propagating in parallel with the plane of said active layer to the external of said semiconductor chip.

2. The diode of claim 1, wherein the angle of a side wall plane of said groove cutting said second clad layer is different from the angle of a side wall plane of said groove cutting said active layer.

3. The diode of claim 2, wherein the angle of a side wall plane of said groove cutting said second clad layer is substantially perpendicular to the plane of said second clad layer.

4. The diode of claim 1, wherein the refractive index of said active layer is n1 and said groove is filled with substance having a refractive index n2 smaller than the refractive index n1.

5. The diode of claim 4, wherein following formulae are satisfied:

$$n \cdot \sin[\theta_2 - \arcsin(\sin\{\theta_1 + \theta_2 - \arcsin(n \cdot \sin\theta_1)\}/n)] \geq 1$$

$$n = n_1/n_2$$

where the angle $\theta_1$ is an angle between the surface of a side wall at the inner side of said groove cutting said active layer and the surface vertical to the plane of said active layer, the angle $\theta_2$ is an angle between the surface of a side wall at the outer side of said groove cutting said active layer and the surface vertical to the plane of said active layer.

6. The diode of claim 5, wherein said substrate is a GaAs substrate.

7. The diode of claim 5, wherein said active layer is made of $In_xGa_yAl_{1-x-y}P$.

8. The diode of claim 5, wherein a peak wavelength in the spectrum of emitted light from said active layer is 580 nm or shorter.

9. The light emitting diode of claim 1, further comprising: a current diffusion layer formed on said second clad layer.

10. The light emitting diode of claim 9, wherein a side length of an outer periphery of the semiconductor chip is 30 to 300 times larger than a total thickness of said active layer, said first clad layer and said current diffusion layer.

11. The light emitting diode of claim 10, wherein said side length of the outer periphery of semiconductor chip is 100 to 1000 μm.

12. A light emitting diode having a semiconductor chip, the semiconductor chip comprising:
  a) a substrate;
  b) a reflection layer formed at least at a partial area over said substrate;
  c) a first clad layer of a first conductivity type formed over said reflection type;
  d) an active layer formed on and over said first clad layer;
  e) a second clad layer of a second conductivity type opposite to the first conductivity type formed on and over said active layer; and
  f) a groove penetrating through said second clad layer and said active layer reaching said first clad layer, the groove having side walls at an inner and an outer side of the groove, each side wall cutting said active layer at an angle to refract light at the side wall,
  wherein said groove is formed at a peripheral area of said semiconductor chip, surrounding a central area of said semiconductor chip, the central area having a large horizontal length relative to a total thickness of said active layer and said second clad layer so as to cause a wavelength shift due to absorption of light propagating in parallel with said active layer, said angle being selected so as not to leak said light propagating in parallel with the plane of said active layer to the external of said semiconductor chip.

13. The diode of claim 12, further comprising a light absorption layer formed between the bottom of said groove and the top of said reflection layer.

14. The diode of claim 13, wherein said light absorption layer is a semiconductor layer having a forbidden band gap narrower than said active layer.

15. The diode of claim 12, further comprising a light absorption layer formed in said reflection layer and under the bottom of said groove.

16. The diode of claim 12, wherein said reflection layer is not formed under said groove.

17. The diode of claim 12, wherein said reflection layer is Bragg reflector mirror comprising quarter-wave stacks.

18. The diode of claim 12, wherein the angle of a side wall plane of said groove cutting said second clad layer is different from the angle of a side wall plane of said groove cutting said active layer.

19. The diode of claim 18, wherein the angle of a side wall plane of said groove cutting said second clad layer is substantially perpendicular to the plane of said second clad layer.

20. The diode of claim 12, wherein the refractive index of said active layer is n1 and said groove is filled with substance having a refractive index n2 smaller than the refractive index n1.

21. The diode of claim 20, wherein following formulae are satisfied:

$$n \cdot \sin[\theta_2 - \arcsin(\sin\{\theta_1 + \theta_2 - \arcsin(n \cdot \sin\theta_1)\}/n)] \geq 1$$

$$n = n_1/n_2$$

where the angle $\theta_1$ is an angle between the surface of a side wall at the inner side of said groove cutting said active layer and the surface vertical to the plane of said active layer, the angle $\theta_2$ is an angle between the surface of a side wall at the outer side of said groove cutting said active layer and the surface vertical to the plane of said active layer.

22. The diode of claim 21, wherein a peak wavelength in the spectrum of emitted light from said active layer is 580 nm or shorter.

23. The light emitting diode claim 12, further comprising: a current diffusion layer formed on said second clad layer.

24. The light emitting diode of claim 23, wherein a side length of an outer periphery of the semiconductor chip is 30 to 300 times larger than a total thickness of said active layer, said first clad layer and said current diffusion layer.

25. The light emitting diode of claim 24, wherein said side length of the outer periphery of semiconductor chip is 100 to 1000 μm.

26. A light emitting diode having a semiconductor chip, the semiconductor chip comprising:
  a) a substrate;
  b) a first clad layer of a first conductivity type formed over said substrate;
  c) an active layer formed on and over said first clad layer;
  d) a second clad layer of a second conductivity type opposite to the first conductivity type formed on and over said active layer; and
  e) a groove penetrating through said second clad layer and said active layer, reaching said first clad layer, the groove having side walls at an inner and an outer side of the groove,
  wherein said groove is formed at a peripheral area of said semiconductor chip, surrounding a central area of said semiconductor chip, the central area being relatively large so as to cause a wavelength shift due to absorption of light propagating in parallel with said active layer, and an angle at which said side walls cut said active layer being selected such that the light refracted at said side walls is totally reflected at a side wall of said semiconductor chip.

27. A light emitting diode having a semiconductor chip, the semiconductor chip comprising:
  a) a substrate;
  b) a reflection layer formed at least at a partial area over said substrate;

c) a first clad layer of a first conductivity type formed over said reflection layer;

d) an active layer formed on and over said first clad layer;

e) a second clad layer of a second conductivity type opposite to the first conductivity type formed on and over said active layer; and f) a groove penetrating through said second clad layer and said active layer, reaching said first clad layer, the groove having side walls at an inner and an outer side of the groove, wherein said groove is formed at a peripheral area of said semiconductor chip, surrounding a central area of said semiconductor chip, the central area being relatively large so as to cause a wavelength shift due to absorption of light propagating in parallel with said active layer, and an angle at which said side walls cut said active layer being selected such that the light refracted at said side walls is totally reflected at a side wall of said semiconductor chip.

* * * * *

UNITED STATES PATENT AND TRADEMARK OFFICE
CERTIFICATE OF CORRECTION

PATENT NO. : 5,753,940
DATED : May 19, 1998
INVENTOR(S) : KOMOTO

It is certified that error appears in the above-indentified patent and that said Letters Patent is hereby corrected as shown below:

Claim 1, column 10, line 36, after "active layer", delete "of".

Claim 23, column 12, line 31, after "emitting diode", insert --of--.

Signed and Sealed this

Thirty-first Day of August, 1999

Attest:

Q. TODD DICKINSON

Attesting Officer     Acting Commissioner of Patents and Trademarks